United States Patent
Mueller et al.

(10) Patent No.: US 7,692,933 B1
(45) Date of Patent: Apr. 6, 2010

(54) APPARATUS AND METHODS FOR INTERCONNECTING ELECTRICAL CIRCUIT SUBSTRATES AND COMPONENTS

(75) Inventors: Donald Mueller, Aurora, IL (US); Deron Stambaugh, Waterman, IL (US); Anthony Russo, Elmhurst, IL (US)

(73) Assignee: TouchSensor Technologies, LLC, Wheaton, IL (US)

( * ) Notice: Subject to any disclaimer, the term of this patent is extended or adjusted under 35 U.S.C. 154(b) by 0 days.

(21) Appl. No.: 12/172,720

(22) Filed: Jul. 14, 2008

Related U.S. Application Data

(60) Provisional application No. 60/959,245, filed on Jul. 12, 2007.

(51) Int. Cl.
*H05K 1/14* (2006.01)

(52) U.S. Cl. ............... 361/804; 361/742; 361/758; 361/770; 174/138 E; 174/138 G

(58) Field of Classification Search ................. 361/742, 361/758, 770, 804, 807, 809; 174/138 E, 174/138 G
See application file for complete search history.

(56) References Cited

U.S. PATENT DOCUMENTS

| | | | | |
|---|---|---|---|---|
| 4,760,495 A | * | 7/1988 | Till ............................. | 361/804 |
| 5,018,982 A | * | 5/1991 | Speraw et al. ................. | 439/74 |
| 5,956,835 A | * | 9/1999 | Aksu ............................ | 29/468 |
| 5,963,432 A | * | 10/1999 | Crowley ...................... | 361/804 |
| 6,140,591 A | * | 10/2000 | Osborne et al. ........... | 174/138 E |
| 6,404,646 B1 | * | 6/2002 | Tsai et al. .................... | 361/758 |
| 6,493,233 B1 | * | 12/2002 | De Lorenzo et al. ........ | 361/752 |
| 6,692,310 B2 | * | 2/2004 | Zaderej et al. .............. | 439/701 |
| 6,781,055 B2 | * | 8/2004 | Chen .......................... | 174/535 |
| 7,233,503 B2 | * | 6/2007 | Chen .......................... | 361/804 |
| 7,333,347 B1 | * | 2/2008 | Liang .......................... | 361/810 |
| 7,447,045 B2 | * | 11/2008 | Ikeya et al. ................. | 361/807 |
| 2006/0146507 A1 | * | 7/2006 | Lee ............................. | 361/758 |

\* cited by examiner

*Primary Examiner*—Dameon E Levi
(74) *Attorney, Agent, or Firm*—Barnes & Thornburg LLP

(57) ABSTRACT

A stand-off having a flange and a projecting portion extending from the flange is integrated with a first substrate, for example, a printed circuit board (PCB), by forming a hole in the PCB, inserting the projecting portion of the stand-off through the hole, and attaching a second substrate to the first substrate with the flange therebetween. The flange can be at least partially received by a relief formed in one of the substrates or in an aperture in an adhesive layer between the two substrates. The stand-off can be further secured to the PCB using one or more of adhesives, interference fit techniques, snap-assembly features, and other applicable techniques. Alternatively, the stand-off can be attached to a substrate using a sliding snap feature or sliding interference fit. An attachable component can be attached to the projecting portion of the stand-off.

15 Claims, 3 Drawing Sheets

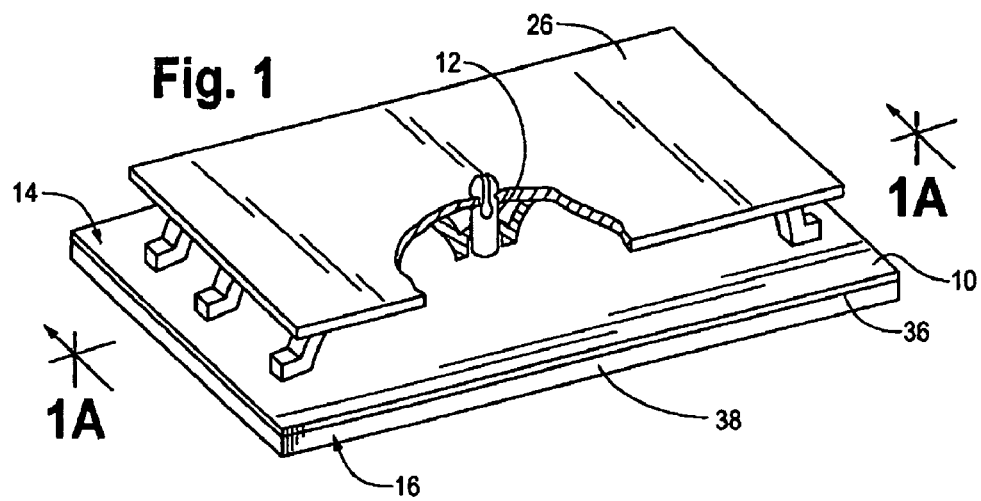
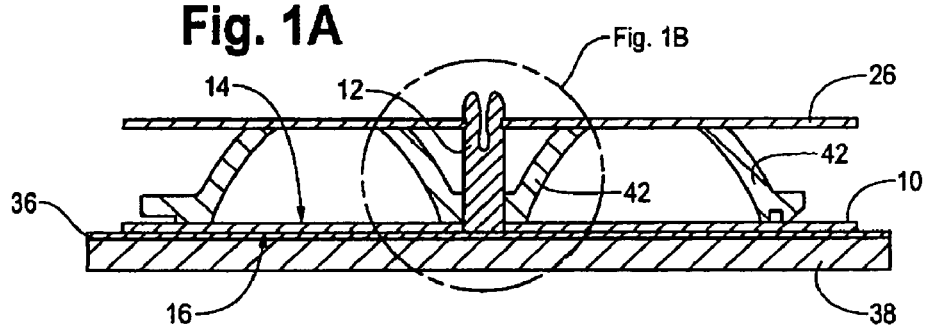
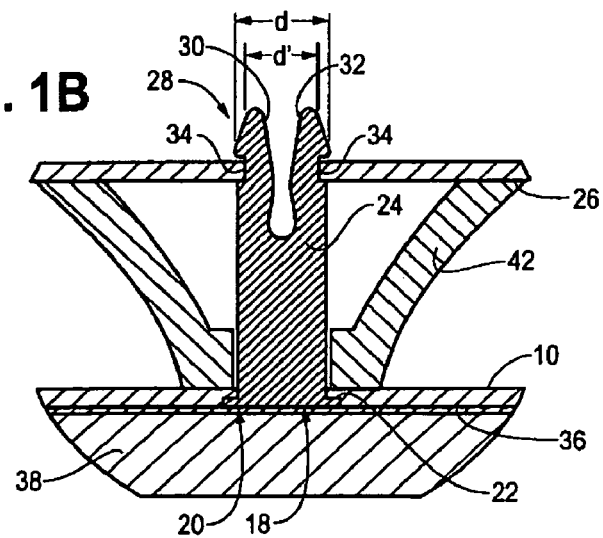

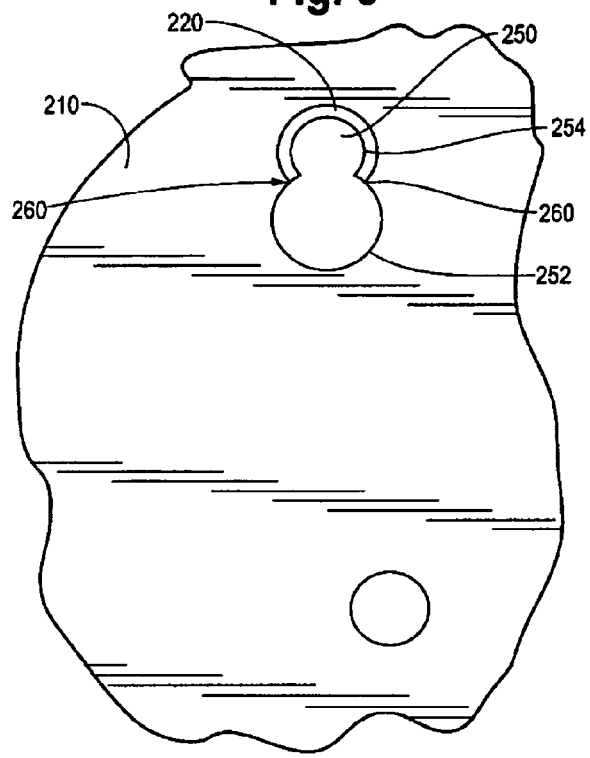
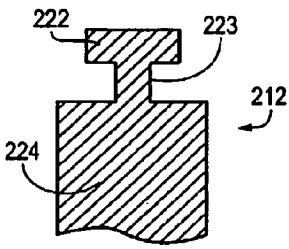
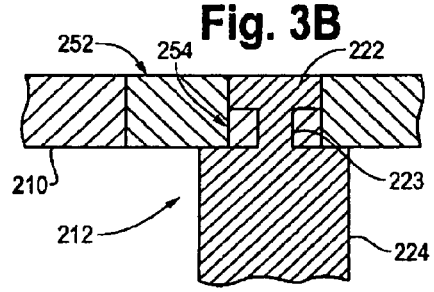
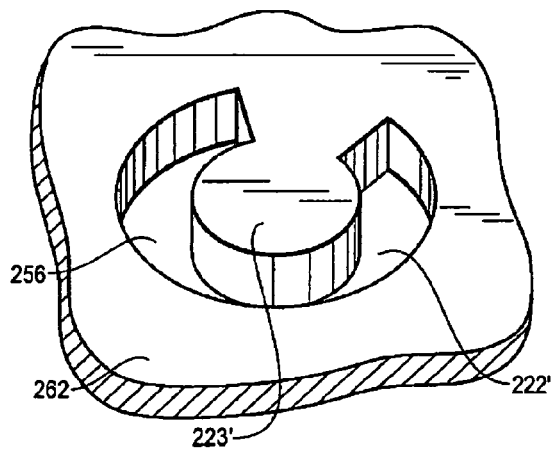
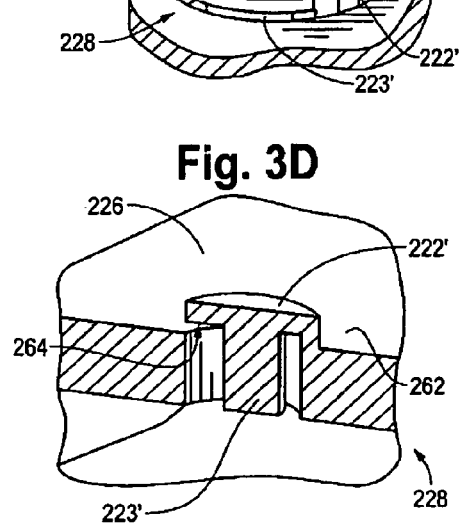

APPARATUS AND METHODS FOR INTERCONNECTING ELECTRICAL CIRCUIT SUBSTRATES AND COMPONENTS

CROSS REFERENCE TO RELATED APPLICATIONS

This application claims priority from, and incorporates by reference the disclosure of, U.S. Provisional Patent Application No. 60/959,245, filed on Jul. 12, 2007.

BACKGROUND OF THE INVENTION

1. The Technical Field

The present invention is directed generally to connection of stand-offs and other components to circuit boards, touch panels, and other substrates and components.

2. The Related Art

It can be desirable to mount additional components, substrates, and/or boards to a printed circuit board ("PCB") or other substrate. It is known to use stand-offs with PCBs to mount additional components to the base PCB substrate. Traditionally, stand-offs have been press-fit into the PCB material, adhered to the PCB using adhesive or glue, or soldered to the PCB. Each of these methods has certain advantages and disadvantages.

For example, press-fit techniques, which rely on physical interference between the stand-off and the PCB substrate, can be implemented relatively easily and inexpensively. The strength of a press-fit connection, however, is a function of the interfering surface area between the stand-off and the PCB, which in turn is a function of the PCB thickness and the relevant stand-off dimension, for example, length. Thus, the strength of the connection between the stand-off and the PCB diminishes with decreasing PCB thickness. This phenomenon places a practical lower limit on the thickness of a PCB that is to incorporate a press-fit stand-off.

Adhesive or glue-based techniques rely on the strength of the adhesive or glue bonding the stand-off to the PCB and the surface area (usually very small) of the stand-off/substrate that the adhesive acts on. If the substrate includes a decorative layer, surface coating, or the like, these techniques may also rely on the integrity of the bond between such layers or coatings and the substrate. As such, adhesive or glue-based techniques may offer only limited strength. Also, adhesive strengths often decrease with increasing temperature. Accordingly, adhesive or glue-based techniques often are not suitable for use in high temperature applications.

Unlike the foregoing techniques, which can be used with stand-offs made of nearly any material, for example, plastic and metal, solder-based techniques generally employ metal stand-offs. Metal stand-offs can be more expensive to manufacture and use than stand-offs made of other materials, for example, plastic. Also, solder-based techniques often are unreliable because the strength of the solder connection is susceptible to variations in the soldering process and the size of the metal stand-off that typically would be used with such a technique because a metal stand-off acts as a heat sink when put through a reflow oven.

Traditional methods typically use rigid PCB materials (0.062" and thicker), which generally are acceptable for flat applications. However, there are multiple benefits to using thinner PCB materials. For example, thinner PCB materials can more easily be formed to mate with other, corresponding three-dimensional substrates. Also, thinner PCB materials (or other substrate materials) often are less costly than thicker materials.

SUMMARY OF THE INVENTION

The present invention provides a novel way of integrating or otherwise mating a connection element, for example, a stand-off or a portion of an attachable component, with a substrate, for example, a PCB, light guide, or other substrate. The substrate may carry, among other components, a non-displacement switch, for example, a field effect sensor, capacitive sensor, optical sensor, or other sensor. The PCB material can be FR-4, but is not limited to a specific material.

A first embodiment is preferred for use in connection with substrates having a thickness of about 0.031" or greater, but could be used with thinner substrates, as well. In this embodiment, a through hole and an associated relief, for example, a counter-bore or countersink, are formed into the substrate. In embodiments where the substrate is, for example, a touch sensor circuit board bearing electrical components on one side and a touch surface on or associated with the other side, the relief preferably is formed on the non-component, or user interface, side of the substrate. A stand-off having a base portion, or flange, and a projecting portion extending from the flange is mated with the hole, such that the flange nests generally with the counter-bore and the projecting portion extends through and from the hole. An adhesive, for example, an adhesive layer, can be applied over the exposed portion of the flange and the substrate to facilitate later attachment of the substrate to another surface, for example, a touch substrate, and to retain the stand-off to the substrate in the meantime. The stand-off preferably includes features enabling the attachment of an attachable component thereto.

A second embodiment is preferred for use in connection with thinner (for example, 0.014" to 0.031" thick) substrates, but could be used with thinner and thicker substrates, as well. This embodiment utilizes a simple through hole in the substrate and a larger hole, proximate the through hole, in an adhesive layer that typically would be applied to a surface of the substrate. The hole in the adhesive layer acts as a relief. A stand-off having a flange and a projecting portion extending from the flange is mated with the hole, such that the flange nests generally within the relief formed into the adhesive layer and the projecting portion extends through and from the through hole. A second substrate is attached to the substrate, covering the adhesive layer and the flange, thereby securing the flange between the two substrates. Preferably the flange and the hole in the adhesive layer are configured so that the adhesive layer retains the stand-off until the substrate is attached to the second substrate. The stand-off preferably includes features enabling the attachment of an attachable component thereto.

A third embodiment is preferred for use in connection with substrates having a thickness of about 0.031" or greater, but could be used with thinner substrates, as well. In this embodiment, a keyway, preferably in the form of a pair of siamesed holes, one somewhat larger in diameter than the other, is formed in the substrate. A relief, for example, a counter bore, preferably is formed about the periphery of the smaller hole. A stand-off having a flange spaced from and connected to a projecting portion by means of a connecting post is configured so that the flange and post can be inserted through the larger hole, but not the smaller hole. The stand-off is further configured so that the projecting portion cannot be inserted through the smaller hole and preferably cannot be inserted through the larger hole, either. The facing surfaces of the flange and the projecting portion preferably are spaced from other by a distance about equal to the thickness of the substrate, less the depth of the relief.

The stand-off can be connected to the substrate by inserting the flange through the larger hole, aligning the connecting post with the substrate, and sliding the stand-off laterally toward the smaller hole, such that the connecting post passes by the constriction formed by the siamesed holes and the flange becomes aligned with and snaps into the relief formed in the substrate about the periphery of the smaller hole, thus securing the stand-off to the substrate. Additional securement could be achieved by configuring the keyway and connecting post as a snap feature. That is, the constriction would be narrower than the relevant dimension of the connecting post such the connecting post would be snapped past the constriction as the stand-off is slid toward the smaller hole. Preferably, the flange and the relief are configured so that the flange is flush with the surface of the substrate adjacent the relief. A second substrate can be attached to the substrate, covering the head of the mating component. The stand-off preferably includes features enabling the attachment of an attachable component thereto. In alternate embodiment, the relevant features of the stand-off can be integrated into the structure of an attachable component, eliminating the need for a separate stand-off and corresponding features or hardware for attaching the attachable component to the stand-off.

BRIEF DESCRIPTION OF THE DRAWINGS

FIG. 1 is a cut-away perspective view of a stand-off connected to a substrate according to an embodiment of the present invention;

FIG. 1A is a cross-sectional view of the apparatus illustrated in FIG. 1;

FIG. 1B is a detail view of a portion of the apparatus illustrated in FIG. 1A;

FIG. 3 is a plan view of a substrate including a keyway for receiving a stand-off according to still another embodiment of the present invention;

FIG. 3A is a cross-sectional view of a portion of a stand-off configured for connection to the substrate illustrated in FIG. 3;

FIG. 3B is a cross-sectional view of the stand-off of FIG. 3A assembled to the substrate of FIG. 3;

FIG. 3C is a perspective view of an attachable component having an integrated feature for connecting the same to the substrate illustrated in FIG. 3;

FIG. 3D is a cross-sectional view of a portion of an attachable component having an integrated feature for connecting the same to the substrate illustrated in FIG. 3; and FIG. 3E is another perspective view of an attachable component having an integrated feature for connecting the same to the substrate illustrated in FIG. 3.

DETAILED DESCRIPTION OF THE ILLUSTRATED EMBODIMENTS

Figure 2:
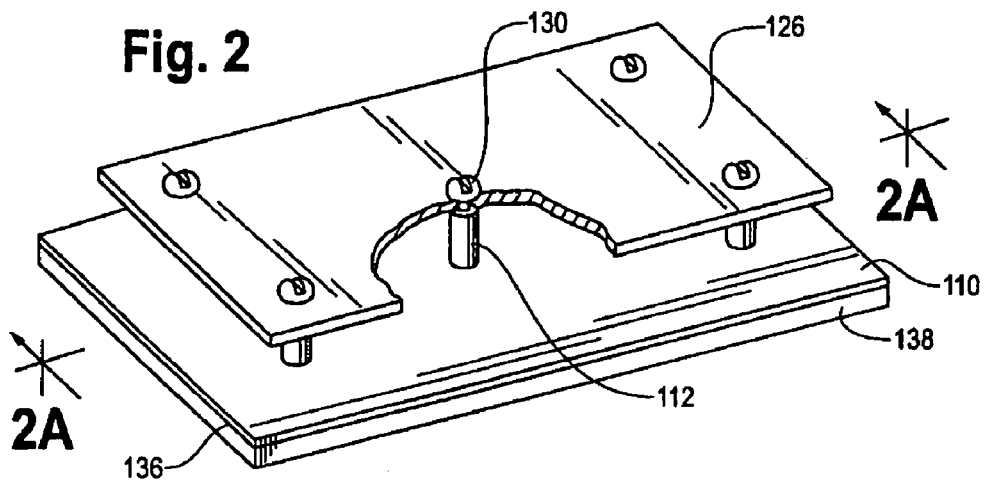
FIG. 2 is a cut-away perspective view of a stand-off connected to a substrate according to another embodiment of the present invention.
Figure 2A:
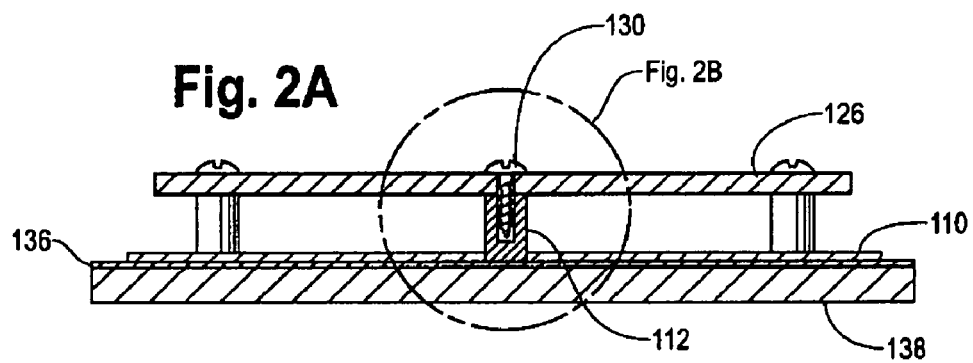
FIG. 2A is a cross-sectional view of the apparatus illustrated in FIG. 2.

FIGS. 1-1B illustrate an embodiment of the present invention including a substrate 10 having an integrated stand-off 12 to which attachable component 26 is attached. This embodiment is preferred in connection with substrates having a thickness of substantially 0.031" or greater, but can be used with thinner substrates, as well. Substrate 10 can be embodied as a fiberglass (e.g., FR4) or paper composite (e.g., CEM1) PCB or any other suitable PCB or other substrate, for example, a ceramic substrate. Stand-off 12 can be made of metal, plastic, or any other suitable material by any suitable process, for example, injection molding or other molding process (e.g., plastic or metal injection molding), machining, or stamping, as might be desired for a particular application. Stand-off 12 can be of any suitable length and could include any suitable mounting/assembly feature capable of attaching attachable component 26 to stand-off 12, as discussed further below. Attachable component 26 can be embodied as any structure or component attachable to substrate 10 using stand-off 12. For example, attachable component 26 could be another PCB or other substrate, a display, or an electrical component or assembly.

Substrate 10 preferably has first and second sides 14 and 16. Substrate 10 preferably includes through hole 18 and counter bore 20 formed therein. Hole 18 and/or counter bore 20 can be molded into substrate 10 and/or otherwise formed by drilling, punching, or other suitable method. In other embodiments, counter bore 20 could be a counter sink or other relief about hole 18. In applications where substrate 10 is a PCB including a touch sensor or other electrical circuit components and/or traces on one side thereof, for example, side 14, counter bore 20 preferably, but not necessarily, is formed on the other side thereof. Alternatively, counter bore 20 could be formed on a side of substrate 10 having such elements.

Stand-off 12 preferably includes a base portion, or flange, 22 and a projecting portion 24. Stand-off 12 is configured to allow projecting portion 24 to be inserted through hole 18 such that at least a portion of flange 22 nests within counter bore 20 or other relief formed in substrate 10. Preferably, the entirety of flange 22 nests within counter bore 20, as shown. An adhesive, preferably in the form of adhesive layer 36, can be applied over the exposed rear surface of flange 22 and at least a portion of the surrounding surface of substrate 10. This adhesive or adhesive layer 36 tends to at least temporarily retain stand-off 12 to substrate 10.

Second substrate 38 is applied to adhesive/adhesive layer 36. Second substrate can be any suitable substrate, for example, a glass or plastic touch substrate for use in connection with touch sensors that might be located on substrate 10. Second substrate 38 preferably overlies at least a portion of flange 22 and a portion of substrate 10 proximate hole 18, thereby capturing stand-off 12 in hole 18 and counter bore 20. In alternate embodiments, second substrate 38 can be attached to substrate 10 by other means, with or without adhesive, sufficient to secure stand-off 12 to substrate 10. For example, one or more snap features could be used to attach second substrate 38 to substrate 10, sandwiching flange 22 of stand-off 12 therebetween, and thereby securing stand-off to the substrate 10/second substrate 38 assembly.

Engagement of stand-off 12 with substrate 10 can be enhanced by configuring stand-off 12, hole 18, and counter bore 20 such that flange 22 fits tightly in counter bore 20 and/or projecting portion 24 fits tightly in hole 18, substantially precluding post-assembly movement of stand-off 12 relative to substrate 10. Engagement of stand-off 12 with substrate 10 can be further enhanced by including a glue or adhesive at the substrate 10/stand-off 12 interface.

Projecting portion 24 includes attachment portion 28 configured to allow for attachment of attachable component 26 to stand-off 12. Typically, attachment portion 28 would be located at or near the end of projecting portion 24 opposite flange 22, but attachment portion 28 could be located elsewhere on stand-off 12. In the FIGS. 1-1B embodiment, attachment portion 28 is embodied as a snap feature configured to mate with corresponding structure on attachable component 26. More particularly, attachment portion 28 is shown as having first and second legs 30 and 32, respectively, each such leg having a retaining groove 34. Preferably, attachable component 26 includes a corresponding attachment hole 40 sized somewhat smaller than the outside dimension d of legs 30, 32 and about the same as inside dimension d' of groove 34. So configured, legs 30, 32 compress together upon insertion into attachment hole 40 and spring apart to secure stand-off 12 to attachable component 26 when inserted to the depth of groove 34, as would be understood by one skilled in the art. The ends of first and second legs 30, 32 are shown as being tapered to facilitate assembly but need not be.

In an alternate embodiment, attachment portion 28 can be embodied as a screw boss for receiving a screw that would join attachable structure 26 to stand-off 12. In such an embodiment, attachable component 26 would include corresponding structure, for example, a hole for receiving the screw, as would be recognized in the art. (FIGS. 2-2b, for example, illustrate an example of such screw and screw boss attachment structure in connection with another embodiment of the invention.) In other alternate embodiments, attachment portion 28 could be a push nut or simply one or more surfaces configured for attachment to one or more corresponding surfaces of attachable component 26 using glue, adhesives, interference fit or other means. Attachment portion 28 of stand-off 12 and any corresponding attachment portion of attachable component 26 could be embodied in other ways, as well, as would be recognized by one skilled in the art.

Stand-off 12 could include multiple attachment portions 28 embodied in similar or dissimilar configurations. For example, in addition to the attachment portion 28 illustrated in FIG. 1, stand-off 12 could include an additional attachment portion 28 nearer substrate 10. This arrangement would allow a first attachable component 26 to be attached to stand-off 12 via the first attachment portion 28 and a second attachable component 26 to be attached to stand-off 12 via the second attachment portion 28.

Optional support members 42 may be provided between substrate 10 and attachable component 26. Though not critical to the invention, support members 42 can help stabilize and maintain the spacing of attachable component 26 with respect to substrate 10. Support members 42, when used, can be located proximate stand-off 12 and/or elsewhere between substrate 10 and attachable component 26 as desired.

Figure 2B:
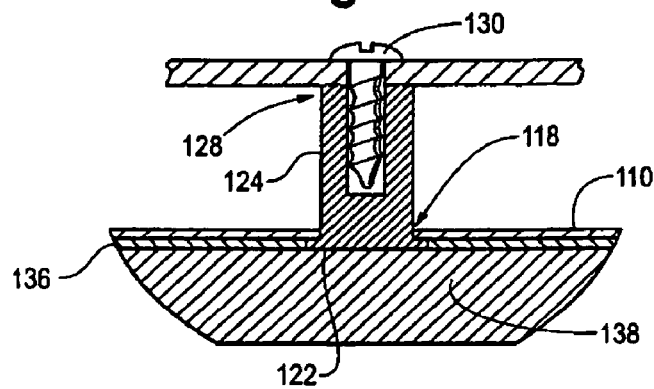
FIG. 2B is a detail view of a portion of the apparatus illustrated in FIG. 2A.

FIGS. 2-2B illustrate an embodiment of the present invention that is preferred for use in connection with substrates having a thickness of between substantially 0.014" and 0.031" but also could be used with thicker or thinner substrates. Similar to the FIG. 1 embodiment, the FIG. 2 embodiment includes substrate 110 having first and second sides 114, 116 and integrated stand-off 112 having flange 122, projecting portion 124, and attachment portion 128, to which attachable component 126 is attached. Substrate 110, stand-off 112, and attachable component 126 can be generally similar in design, construction, and materials to the corresponding elements of the FIGS. 1-1B embodiment, with certain exceptions as will be apparent from the following discussion.

Substrate 110 includes through hole 118 configured to receive projecting portion 124 of stand-off 112. Substrate 110 differs from substrate 10 of the FIGS. 1, 1A, and 1B embodiment in that substrate 110 preferably does not include a relief for receiving flange 122 of stand-off 112. As such, with projecting portion 124 of stand-off 112 inserted into hole 118, the surface of flange 122 adjacent projecting portion 124 preferably abuts the corresponding surface of substrate 110, for example, the surface of second side 116 of substrate 110. An adhesive could be provided at the flange 122/substrate 110 interface to temporarily retain stand-off 112 to substrate 110. In applications where substrate 110 is a PCB including a touch sensor or other electrical circuit components and/or traces on one side thereof, for example, side 114, stand-off 112 preferably, but not necessarily, would be received through hole 118 from the other side thereof. An adhesive, preferably in the form of adhesive layer 136, is applied over at least a portion of the surface of substrate 110 about flange 122. Adhesive layer 136 preferably includes a hole 137 therein to accommodate flange 122. Preferably, hole 137 in adhesive layer 136 is configured such that a portion of its adhesive contacts at least a portion of the periphery of flange 122 such that adhesive layer 136 tends to at least temporarily retain stand-off 112 in hole 118.

Second substrate 138 is applied to adhesive/adhesive layer 136. Second substrate 138 can be any suitable substrate, for example, a glass or plastic touch substrate for use in connection with touch sensors that might be located on substrate 110. Second substrate 138 preferably overlies at least a portion of flange 122 and a portion of substrate 110 proximate hole 118, thereby capturing stand-off 112 in hole 118. Engagement of stand-off 112 with substrate 110 could be enhanced by configuring stand-off 112 and hole 118 such that projecting portion 124 fits tightly in hole 118, substantially precluding post-assembly movement of stand-off 112 relative to substrate 110. Engagement of stand-off 112 with substrate 110 could be further enhanced by including a glue or adhesive at the substrate 110/stand-off 112 interface.

The end of projecting portion 124 of stand-off 112 opposite flange 122 includes attachment portion 128 in the form of a screw boss configured to receive screw 130 retaining attachable structure 126 to stand-off 112. Attachable component 126 preferably includes screw hole 140 or a slot for receiving screw 130. In an alternate embodiment, attachment portion 128 could be embodied as a snap feature, for example, a snap feature similar to that set forth above in connection with the FIGS. 1-1B embodiment, and attachable component 126 would have corresponding structure, for example, an attachment hole similar to attachment hole 40 in attachable component 26, to enable snap attachment of attachable component 126 to stand-off 112. In other alternate embodiments, attachment portion 128 could be a push nut or simply one or more surfaces configured for attachment to one or more corresponding surfaces of attachable component 126 using glue, adhesives, interference fit, or other means. Attachment portion 128 of stand-off 112 and any corresponding attachment portion of attachable component 126 could be embodied in other ways, as well, as would be recognized by one skilled in the art.

FIGS. 3-3B illustrate a further embodiment of the present invention including substrate 210 and stand-off 212 to which attachable component 226 can be attached, and FIGS. 3C-3E illustrate an alternate embodiment wherein attachable component 226 includes integral attachment structure similar to that of stand-off 212 through which attachable component 226 can be attached directly to substrate 210 without using a separate stand-off and corresponding attachment features and/or hardware.

Substrate 210 includes keyway 250 formed therein. Keyway 250 can be formed in substrate 210 by any suitable method, for example, one or more of the methods described above in connection with the FIGS. 1-1A and 2-2B embodiments. In the illustrated embodiment, keyway 250 takes the form of a pair of siamesed holes 252, 254 joined at constriction 260. In the illustrated embodiment, hole 252 is somewhat larger than hole 254, as will be discussed further below. One side of substrate 210 preferably includes a relief, for example, a counter bore, 220 about the periphery of hole 254. The other side of substrate 210 also could include a relief about the periphery of hole 254, provided that substrate 210 is of sufficient thickness, as would be recognized by one skilled in the art.

Stand-off 212 includes flange 222, projecting portion 224, and post 223 connecting the two. Flange 222 is configured so that it can be inserted through hole 252 but not hole 254. Projecting portion 224 is configured so that it cannot be inserted through hole 254 and preferably so that it cannot be inserted through hole 252, either. Connecting post 223 preferably is dimensioned so that it separates the facing surfaces of flange 222 and projecting portion 224 by a distance about equal to the thickness of substrate 210, less the depth of counter bore 220 (and the depth of the corresponding counter bore, if any, formed into the opposite surface of substrate 210). As such, the distance between the facing surfaces of flange 222 and projecting portion 224 is slightly less than the thickness of substrate 210 about keyway 250. Connecting post 223 and constriction 260 are configured such that connecting post 223 can slide past constriction 260, either freely or forcibly, as will be discussed further below.

Stand-off 212 can be assembled to substrate 210 by inserting flange 222 through hole 252, aligning post 223 with substrate 210 such that the facing surfaces of flange 222 and projecting portion 224 are positioned generally parallel and adjacent to respective opposite surfaces of substrate 210, and sliding stand-off 212 toward hole 254 until flange 222 aligns with counter bore 220, thereby capturing substrate 210 between flange 222 and projecting portion 224. Because the distance between the facing surfaces of flange 222 and projecting portion 224 preferably is slightly less than the thickness of substrate 210 about keyway 250 but preferably about the same as the thickness as substrate 210 less the depth of relief 220 (and any corresponding relief on the opposite side of substrate 210), stand-off 212 and/or substrate 210 deform slightly as stand-off 212 is slid toward hole 254 and rebound once flange 222 aligns with counter bore 220, such that flange 222 snaps into counter bore 220, thus securing stand-off 212 to substrate 210. (In alternate embodiments wherein a corresponding counter bore is formed on the opposite surface of substrate 210, the portion of projecting portion 224 adjacent post 223 could be configured to similarly snap into that corresponding counter bore.) The engagement of stand-off 212 to substrate 210 could be enhanced by configuring post 223 and constriction 260 such that post 223 becomes snap secured to hole 254 once it has slid past constriction 260, as would be recognized by one skilled in the art. Preferably, flange 222 and counter bore 220 are configured so that flange 222 is flush with the surface of substrate 210 adjacent counter bore 220. A second substrate (not shown) could be attached to the surface of substrate 210 adjacent to flange 222 using any of the means described above in connection with the FIGS. 1-1B and 2-2B embodiments, covering at least a portion of flange 222, thereby further securing stand-off 212 to substrate 210.

Stand-off 212 preferably includes features (not shown) enabling the attachment of an attachable component thereto. For example, stand-off 212 could incorporate any of the attachment features discussed above in connection with stand-offs 12, 112 of the FIGS. 1-1B and 2-2B embodiments, respectively. Alternatively, as shown in FIGS. 3C-3E, features of stand-off 212 relevant to its connection to substrate 210 can be integrated into the structure of attachable component 226, eliminating the need for a separate stand-off and corresponding features or hardware for attaching the attachable component to the stand-off. FIGS. 3C-3E illustrate a portion of attachable component 226 having integrated attachment structure 258 configured for attachment to substrate 210. Attachment structure 258 includes a base portion 262 configured to abut a surface of substrate 210. Base portion 262 defines aperture 256 and post 223', one end of which extends beyond the surface of base portion 262 destined to abut substrate 210, as will be discussed further below. Flange 222' is connected to that same end of post 223' such that a surface 264 of flange 222' generally faces in the direction of and is substantially parallel to the surface of base portion 262 destined to abut substrate 210. The distance between the "facing" surfaces of flange 222' and base portion 262 is about equal to the thickness of substrate 210, less the depth of counter bore 220. As such, the distance between the "facing" surfaces of flange 222' and base portion 262 preferably is slightly less than the thickness of substrate 210 generally about keyway 250.

Attachable component 226 can be attached to substrate 210 by inserting flange 222' and the adjacent portion of post 223' through hole 252 and then sliding attachable component 226 relative to substrate 210 such that post 223' moves toward and into hole 254 and flange 222' moves toward and into alignment with counter bore 220. Once flange 222' becomes aligned with counter bore 220, flange 222' snaps into counter bore 220, thereby securing attachable component 226 to substrate 210. Engagement of attachable component 226 to substrate 210 can be enhanced by configuring post 223' and constriction 260 such that post 223' becomes snap secured to hole 254 once it has been slid past constriction 260, as would be recognized by one skilled in the art. Preferably, attachment structure 228 and counter bore 220 are configured so that flange 222' is flush with the surface of substrate 210 adjacent counter bore 220 in the assembled state. A second substrate (not shown) could be attached to the surface of substrate 210 adjacent to flange 222 using any of the means described above in connection with the FIGS. 1-1B and 2-2B embodiments, covering at least a portion of flange 222, thereby further securing stand-off 212 to substrate 210.

Although keyway 250 is illustrated and described herein as a pair of differently sized siamesed holes 252, 254, the smaller of which includes an associated counter bore 220, keyway 250 can take other forms in alternate embodiments. For example, keyway 250 could be generally triangular or configured as adjacent rectangular shapes of different sizes, provided that keyway 250 is configured to accept and "secure" stand-off 212 to substrate 210, as would be recognized by one of skill in the art. Similarly, although flange 222 of stand-off 212 is illustrated as generally cylindrical, flange 222 can take other forms, as well, that are configured for securement to substrate 210 according to the principles discussed above.

Among other advantages, the present invention generally provides for better securement of, and load transfer from, the stand-off to the substrate, compared to conventional techniques. Also, implementation of the stand-offs of the present invention is not as susceptible to in-house process variations as conventional techniques. It typically yields easy assembly and does not require in-house monitoring, reflow ovens, or special handling.

Additional and/or alternative retention features, for example, threaded connections, quarter-turn fasteners or features thereof, and the like, could be used in connection with the foregoing techniques to further secure the stand-offs to the respective substrates and/or to secure attachable components to the stand-offs.

The foregoing embodiments are presented for illustration and are not intended to limit the scope of the invention, which is defined by the following claims. One skilled in the art would recognize how to modify these embodiments without departing from the scope of the claims.

The invention claimed is:

1. An electrical circuit apparatus comprising:
a first substrate, said first substrate defining a first aperture;
a first standoff, said first standoff having a flange, a projecting portion projecting from said flange, and an attachment portion associated with said projecting portion; and
a second substrate attached to said first substrate;
wherein said projecting portion of said first standoff penetrates said first aperture;
wherein said second substrate overlies at least a portion of said flange thereby capturing said flange between said first substrate and said second substrate; and
wherein said attachment portion is configured for attachment to an attachable component.

2. The electrical circuit apparatus of claim 1 wherein said first substrate further defines a relief associated with said first aperture, said relief receiving at least a portion of said flange.

3. The electrical circuit apparatus of claim 2 further comprising an adhesive between said second substrate and said first substrate.

4. The electrical circuit apparatus of claim 3 wherein said adhesive overlies at least a portion of said flange.

5. The electrical circuit apparatus of claim 1 further comprising an adhesive between said second substrate and said first substrate, said adhesive taking the form of a layer having an aperture, said aperture receiving at least a portion of said flange.

6. The electrical circuit apparatus of claim 1 further comprising an attachable component attached to said attachment portion of said first standoff.

7. The electrical circuit apparatus of claim 1 wherein said attachable component is attached to said attachment portion by one or more of a threaded fastener and a snap feature.

8. An electrical circuit apparatus comprising:
a first substrate defining a keyway;
a stand-off having a flange, a projecting portion extending from said flange, and a post separating said flange from said projecting portion;
said keyway configured to allow said flange to pass through a first portion thereof;
said keyway further configured to not allow said flange to pass through a second portion thereof; and
a relief associated with said second portion of said keyway, said relief receiving at least a portion of said flange when said flange is associated with said second portion of said keyway.

9. The electrical circuit apparatus of claim 8 wherein said keyway is configured as a pair of siamesed holes, one of said holes configured to allow said flange to pass therethrough and the other of said holes configured not to allow said flange to pass therethrough.

10. The electrical circuit apparatus of claim 8 wherein said stand-off is configured for attachment to an attachable component.

11. The electrical circuit apparatus of claim 8 wherein said stand-off is an integral portion of an attachable component.

12. The electrical circuit apparatus of claim 8 wherein said flange is substantially flush with said first substrate when said flange is associated with said second portion of said keyway.

13. The electrical circuit apparatus of claim 8 wherein said flange does not extend beyond any surface of said first substrate when said flange is associated with said second portion of said keyway.

14. The electrical circuit apparatus of claim 8 wherein said projecting portion comprises a surface of a second substrate.

15. An electrical circuit apparatus comprising:
a first substrate defining a keyway;
a second substrate having a first surface, a post extending from said first surface, and a flange extending from said post;
said keyway configured to allow said flange to pass through a first portion thereof;
said keyway further configured to not allow said flange to pass through a second portion thereof; and
a relief associated with said second portion of said keyway, said relief receiving at least a portion of said flange when said flange is associated with said second portion of said keyway.

* * * * *